United States Patent
Phelan et al.

(10) Patent No.: US 6,499,089 B1
(45) Date of Patent: Dec. 24, 2002

(54) METHOD, ARCHITECTURE AND CIRCUITRY FOR INDEPENDENTLY CONFIGURING A MULTIPLE ARRAY MEMORY DEVICE

(75) Inventors: Cathal G. Phelan, Mountain View, CA (US); Scott Harmel, Gilroy, CA (US); Rajesh Manapat, Mountain View, CA (US); Sunil Kumar Koduru, Sunnyvale, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/484,975

(22) Filed: Jan. 18, 2000

(51) Int. Cl.[7] .............................................. G06F 12/00
(52) U.S. Cl. ........................ 711/153; 711/170; 711/149
(58) Field of Search .................................. 711/129, 131, 711/149, 153, 173

(56) References Cited

U.S. PATENT DOCUMENTS 5,911,149 A * 6/1999 Luan et al. .................. 711/147
5,933,855 A * 8/1999 Rubinstein ................... 711/200
6,128,245 A * 10/2000 Seguchi .................. 365/230.03

* cited by examiner

Primary Examiner—Hong Chong Kim
Assistant Examiner—Paul Baker
(74) Attorney, Agent, or Firm—Christopher P. Maiorana, P.C.

(57) ABSTRACT

A circuit generally comprising a memory and a logic circuit. The memory may comprise (i) a first section configured to (a) read and write data and (b) have a first configurable size and (ii) a second section configured to (a) read and write data independently of the first section and (b) have a second configurable size. The logic circuit may be configured to control the first configurable size and the second configurable size.

19 Claims, 6 Drawing Sheets

METHOD, ARCHITECTURE AND CIRCUITRY FOR INDEPENDENTLY CONFIGURING A MULTIPLE ARRAY MEMORY DEVICE

FIELD OF THE INVENTION

The present invention relates generally to a method and/or architecture to implement a multiple array memory device in a single die and, more particularly, to a dual SRAM in a single die with configurable sizes.

BACKGROUND OF THE INVENTION

Conventional approaches for implementing two SRAM circuits implementing two individual SRAMs on more than one die. Implementing more than one die in an application such as a computer motherboard or other device takes up additional board space. Such a dual implementation also requires additional die space, increasing costs.

SUMMARY OF THE INVENTION

The present invention concerns a circuit generally comprising a memory and a logic circuit. The memory may comprise (i) a first section configured to (a) read and write data and (b) have a first configurable size and (ii) a second section configured to (a) read and write data independently of the first section and (b) have a second configurable size. The logic circuit may be configured to control the first configurable size and the second configurable size.

The objects, features and advantages of the present invention include providing a method and/or architecture that may implement (i) a configurable SRAM architecture, (ii) two or more dual independent SRAMs on a single die and/or (iii) a single circuit in applications that presently require two SRAMs.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
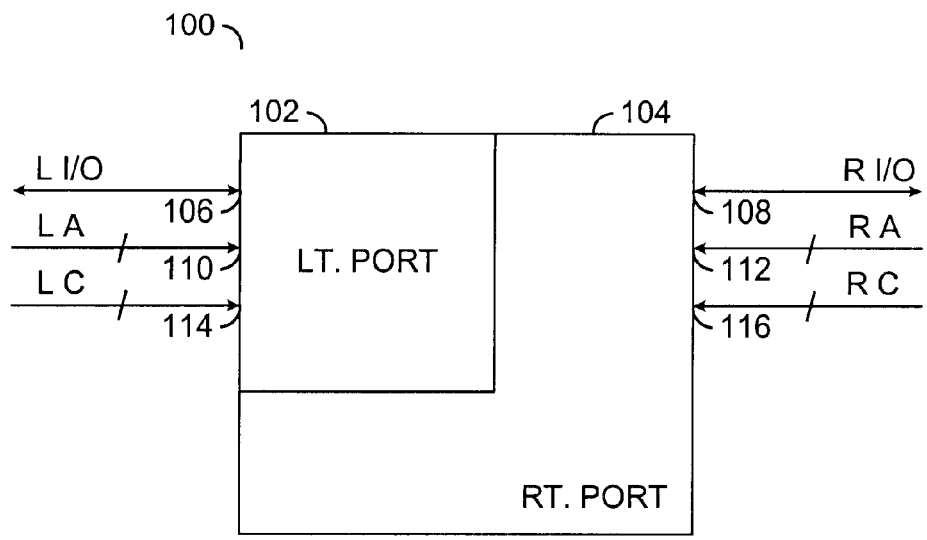
FIG. 1 is a block diagram of a preferred embodiment of the present invention.

Referring to FIG. 1, a block diagram of a circuit 100 is shown in accordance with a preferred embodiment of the present invention. The circuit 100 may be implemented, in one example, as a configurable dual port memory device. The circuit may be implemented as an SRAM, a DRAM, a FLASH memory, or other memory appropriate for the design criteria of a particular implementation. The circuit may comprise a port 102 and a port 104. The ports 102 and 104 may be implemented as a left port and a right port (or vice versa), respectively. The circuit 100 may have a number (e.g., N bits), where N is an integer. The ports 102 and 104, in combination, may comprise a total number of bits M. The number N may be the same or different than the number M. The left port 102 and/or the right port 104 may each, in combination, comprise any number of bits to which the total number of bits may be M bits. The bit sizes of the ports 102 and 104 may be independently configurable. The bit sizes of each port 102 and 104 may be configured at power up or after power up.

The circuit 100 may be connected to a bus (e.g., LI/C) at a connection 106 and a bus (e.g., RI/C) at a connection 108. The busses LR/I and RI/O may communicate data to and/or from the circuit 100. The circuit 100 may receive one or more signals (e.g., LA) at an input 110 and one or more signals (e.g., RA) at an input 112. The signals LA and RA may be implemented as left and right address signals, respectively.

The circuit 100 may receive one or more signals (e.g., LC) at an input 114 one or more signals (e.g., RC) at an input 116. The signals LC and RC may be implemented as left and right port control signals, or any other signal type in order to meet the design criteria of a particular implementation. The signals LC and RC may control writing to and/or reading from the left and right ports 102 and 104. The ports 102 and 104 may each independently access one or more SRAM blocks (to be described in more detail in connection with FIG. 4). The ports 102 and 104 may each write to and/or read from a separate SRAM block (to be discussed in more detail in connection with FIG. 4).

Figure 2:
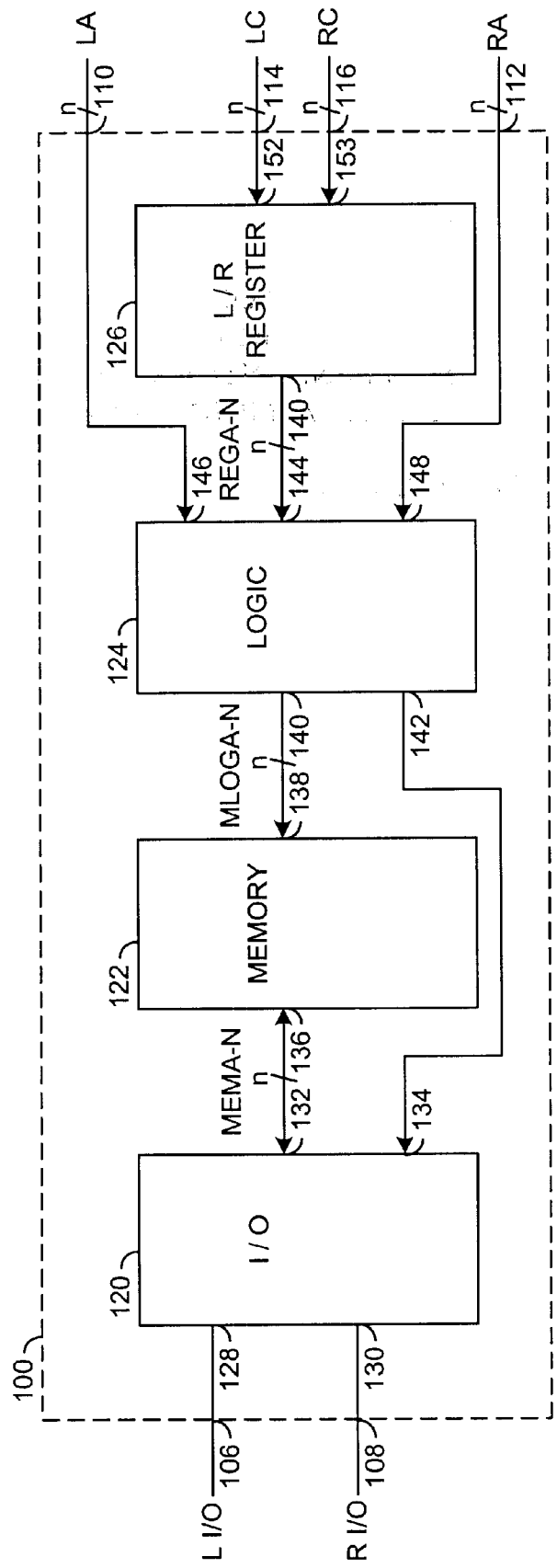
FIG. 2 is a more detailed block diagram of the circuit of FIG. 1.

Referring to FIG. 2 a detailed block diagram of the circuit 100 is shown. The circuit 100 may comprise an I/O block (or circuit) 120, a memory block (or circuit) 122, a logic block (or circuit) 124 and a register block (or circuit) 126. The I/O block 120 may be connected to the LI/O bus at a connection 128. The I/O block 120 may be connected to the RI/O bus at a connection 130. The I/O block 120 may be connected to a number of busses (e.g., MEMa–MEMn) at a connection 132. The I/O block 120 may receive a number of signals (e.g., LOGa–LOGn) at an input 134. The I/O block 120 may communicate data to and/or from the busses LI/O and RI/O to the busses MEMa–MEMn. The I/O block 120 may communicate the data in response to the signals LOGa–LOGn.

The memory block 122 may be connected to the busses MEMa–MEMn at a connection 136. The memory block 122 may store data in response to the I/O block 120. The memory block 122 may receive a number of signals (e.g., MLOGa–MLOGn) at an input 138. The signals MLOGa–MLOGn may be decoded address lines that may be generated by the logic block 124. An input address, along with control signals from the register 126 may be used to generate addresses for the memory blocks to be written/read.

The logic block 124 may generate the signals MLOGa–MLOGn at an output 140. The logic block 124 may generate the signals LOGa–LOGn at an output 142. The logic block 124 may receive a number of signals (e.g., REGa–REGn) at an input 144. The signals REGa–REGn may control the address location presented by the logic block 124. The signals REGa–REGn may also control the data in/out on the I/O pins presented by the block 120. The logic block 124 may receive the signal LA at an input 146.

The logic block may receive the signal RA at an input 148. The signals LA and RA may present left and right port address information to the logic block 124.

In one example, the register 126 may be implemented as a left/right sizing register. However, the register 126 may be implemented as any type of register in order to meet the criteria of a particular implementation. The register 126 may present the signals REGa–REGn at an output 150. The register 126 may store information about the SRAMs block size of the left and the right ports. The register 126 may receive the signal LC and the signal RC at a number of inputs 152 and 153.

Figure 3:
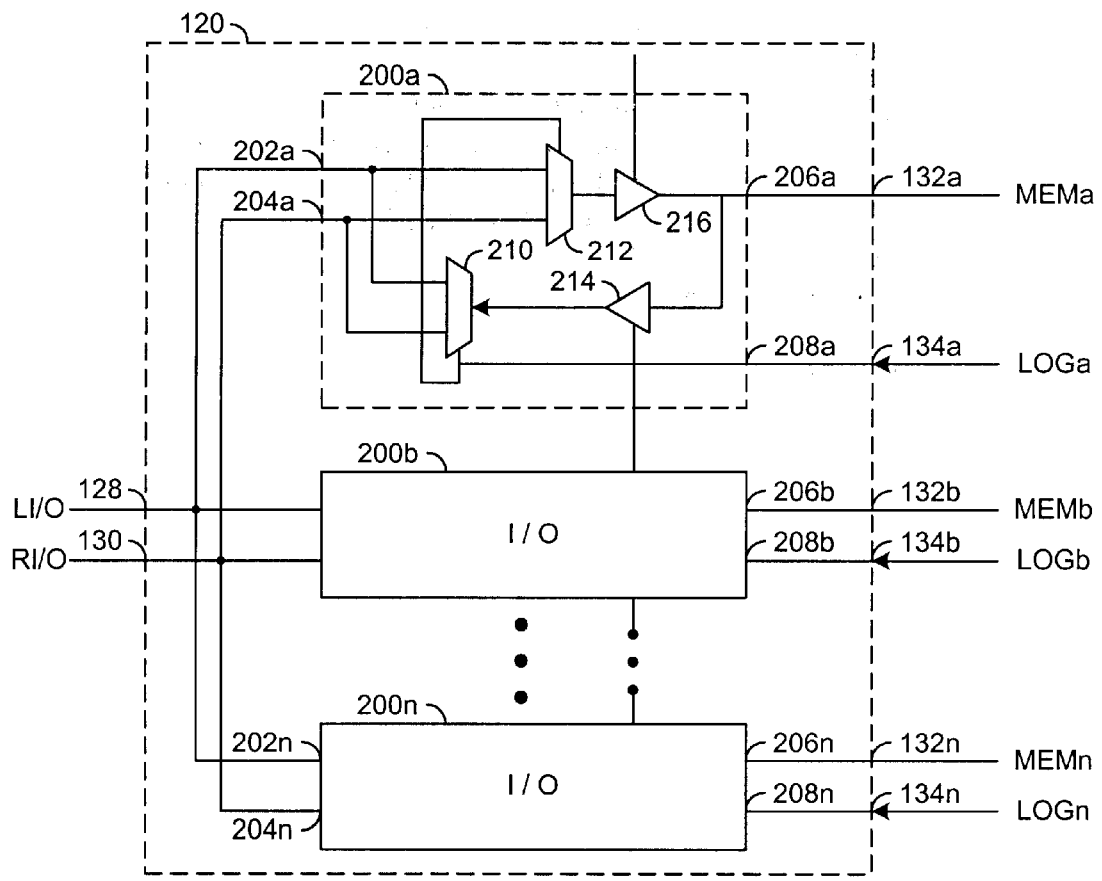
FIG. 3 is a detailed block diagram of the I/O block of FIG. 2.

Referring to FIG. 3 a detailed circuit diagram of the I/O block 120 is shown. The I/O block 120 may route proper data from any of the memory blocks 122 to the proper I/O in accordance with the setting in the sizing register 126. The I/O block 120 may comprise a plurality of I/O sections 200a–200n. Each I/O section 200a–200n may be connected to the bus LI/O at a connection 202a–202n. Each I/O section 200a–200n may be connected to the bus RI/O at a connection 204a–204n. Each I/O section 200a–200n may receive the signals MEMa–MEMn at an input 206a–206n, respectively. Each I/O section 200a–200n may receive the signal LOGa–LOGn at an input 208a–208n, respectively. Each I/O section 200a–200n may comprise a multiplexer 210, a multiplexer 212, an inverter 214 and an inverter 216. The multiplexer 210 may receive data through the inverter 214 from the bus MEMa. The multiplexer 210 may multiplex the data to the busses LI/O and RI/O in response to the signal LOGa. The multiplexer 212 may receive data from the busses LI/O and RI/O. The multiplexer 212 may multiplex the data to the bus MEMa through the inverter 216 in response to the signal LOGa. The I/O sections 200b–200n may comprise similar components and/or operate similar to the I/O section 200a.

Figure 4:
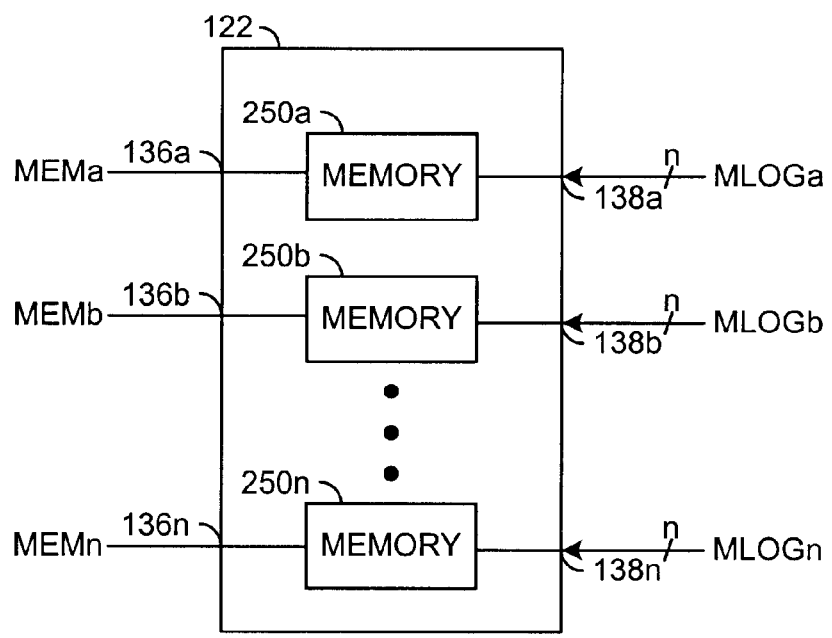
FIG. 4 is a detailed block diagram of the memory block of FIG. 2.
Figure 7:
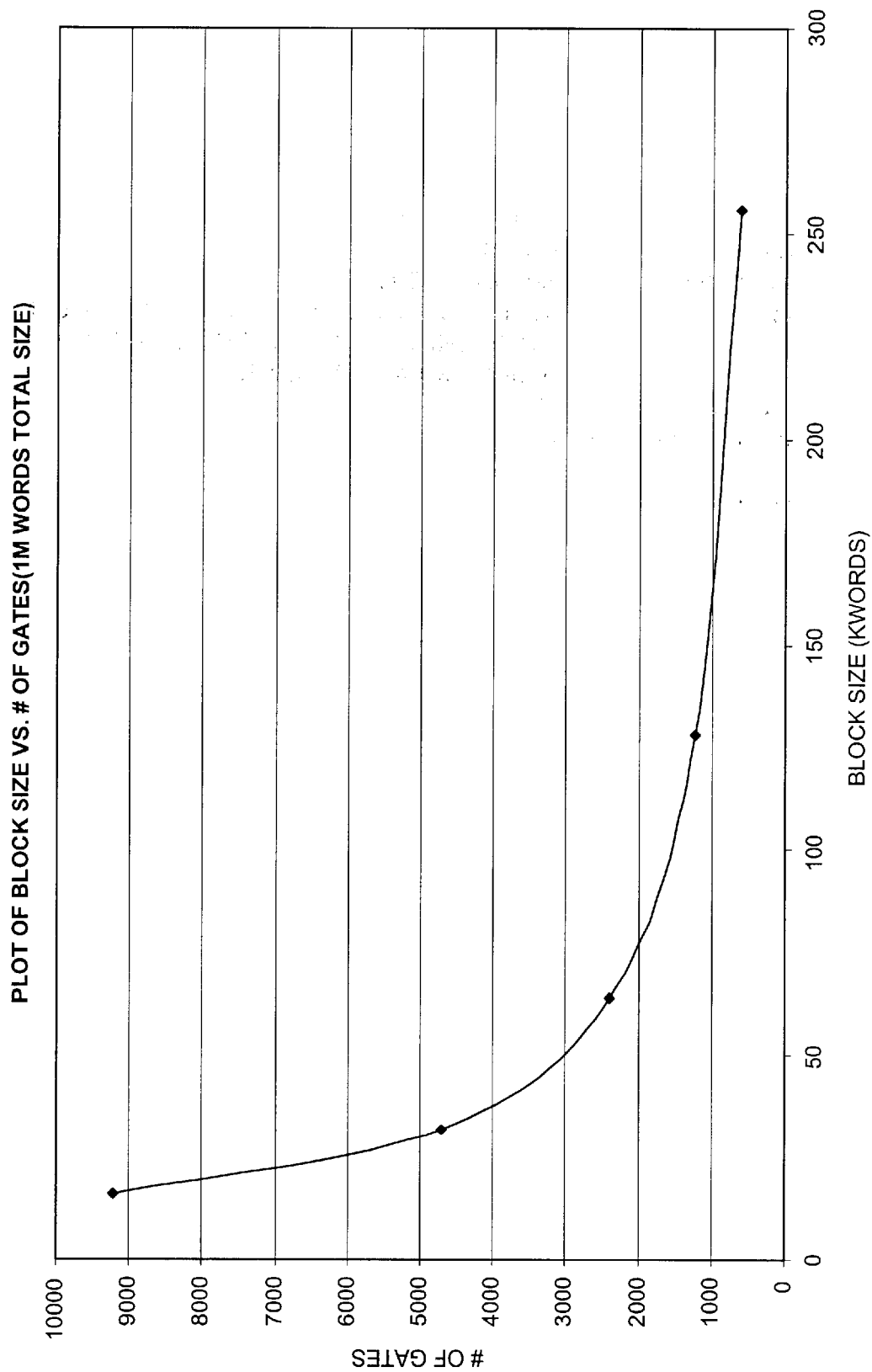
FIG. 7 is a plot illustrating block size versus the number of gates of the dual port SRAM of FIG. 1.

Referring to FIG. 4 a detailed block diagram of the memory block 122 is shown. The memory block 122 may comprise a plurality of memory sections 250a–250n. The memory sections 250a–250n may be implemented, in one example, as equal sized SRAM blocks. In one example, the dual port SRAM 100 may be implemented as a 1 meg SRAM. In such configuration, the SRAM 100 may implement the SRAM blocks 250a–250n as 256K block SRAMS. However, the circuit 100 and the SRAM blocks 250a–250n may be implemented as any size SRAM and/or SRAM blocks in order to meet the criteria of a particular implementation. The minimum size for a SRAM block 250a–250n may be set by the desired granularity of the dual port SRAM 100 block size. The plot of FIG. 7 illustrates the increase in complexity of the circuit 100 as the SRAM block size 250a–250n changes.

The circuit 100 may be configured to control connections of the SRAM blocks 250a–250n between the ports 102 and 104. The circuit 100 may be implemented to configure the SRAM blocks 250a–250n by latching some of the signals LC and/or RC on power up. The latching of signals LC and/or RC may be implemented to control the connections of the SRAM blocks 250a–250n. Once the proper value is written into the register 126, the left and right ports may operate independently.

Figure 5:
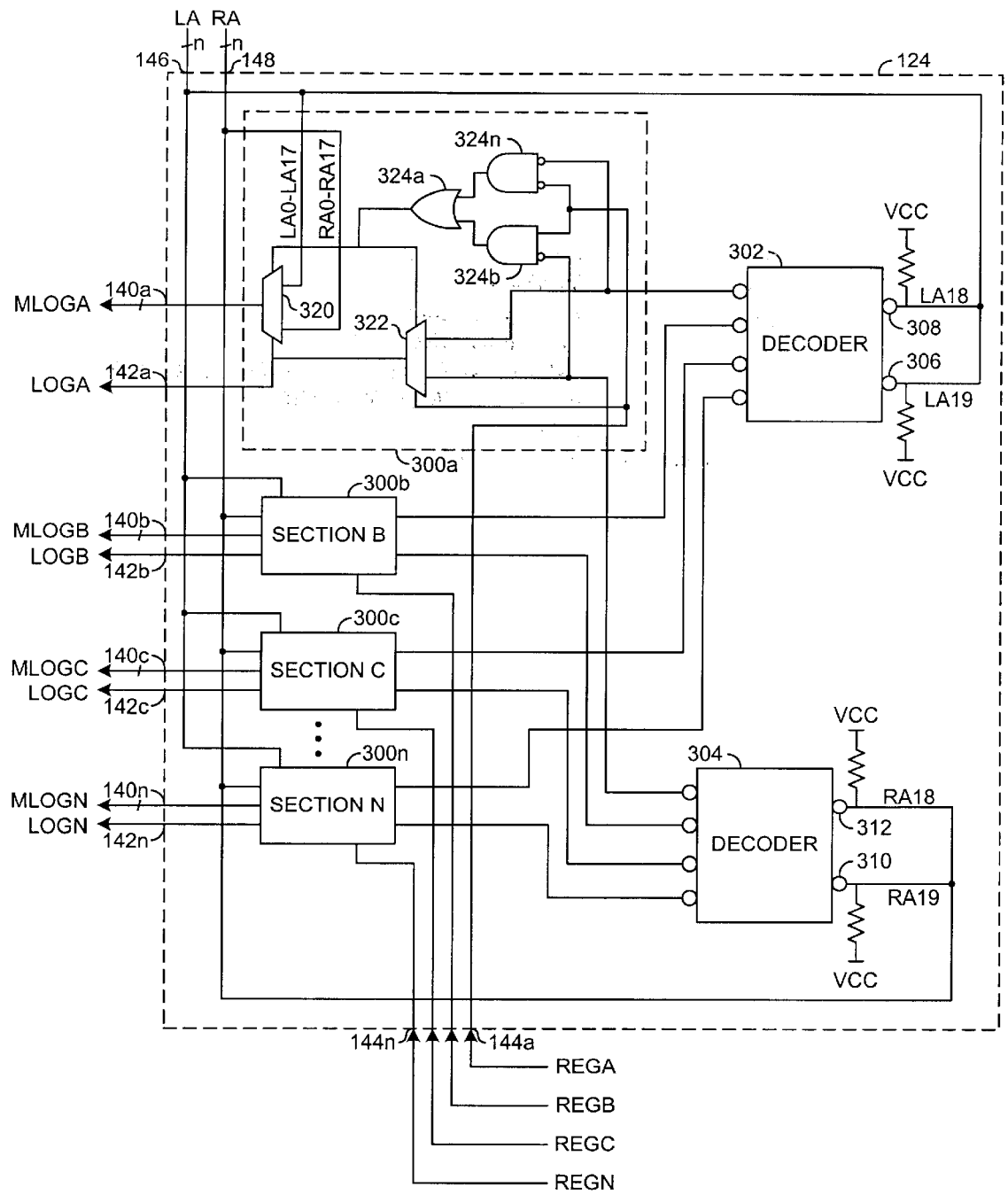
FIG. 5 is a detailed circuit diagram of an implementation of the memory block.

Referring to FIG. 5 a detailed circuit diagram of the logic block 124 is shown. The logic block 124 may comprise a plurality of sections 300a–300n. The logic block 124 may further comprise a decoder 302 and a decoder 304. The sections 300a–300n may present the signals MLOGa–MLOGn at a number of outputs 140a140n. The signals MLOGa–MLOGn may be address signals, or any other type of control and/or access signal in order to meet the criteria of a particular implementation.

The decoder 302 may receive the signal LA19 at an input 306 and the signal LA18 at an input 308. The signals LA19 and LA18 may each be connected to an independent voltage source Vcc. The decoder 304 may receive the signal RA19 at an input 310 and the signal RA18 at an input 312. The signals RA19 and RA18 may each be connected to an independent voltage source Vcc. Each section 300a–300n may be connected to the decoder 302 and the decoder 304. In one example, the decoder 302 may be implemented as a 2-4 left port decoder and the decoder 304 may be implemented as a 2-4 right port decoder. However, the decoders 302 and 304 may each be implemented as any type decoder in order to meet the criteria of a particular implementation. The left and right decoders 302 and 304 may control the sections 300a–300n.

The section 300a may comprise a multiplexer 320, a multiplexer 322 and a plurality of gates 324a–324n. The multiplexer 320 may multiplex address information to the signal MLOGa. The multiplexer 320 may multiplex the information in response to the plurality of gates 324a–324n and the multiplexer 322. The multiplexer 322 may multiplex decoded left and right port information from the left and right decoders 302 and 304. The multiplexer 322 may multiplex the information in response to the plurality of gates 324a–324n and the signal REGa.

The plurality of gates 324a–324n may each be implemented as any type of logic gate in order to meet the criteria of a particular implementation. The plurality of logic gates 324a–324n may control the multiplexer 320 and/or the multiplexer 322. The plurality of gates 324a–324n may control the multiplexers 320 and 322 in response to the signal REGa and the left decoder 302. Each of the sections 300b–300n may comprise similar components to and/or operate similar to the section 300a described previously and will not be discussed.

Figure 6:
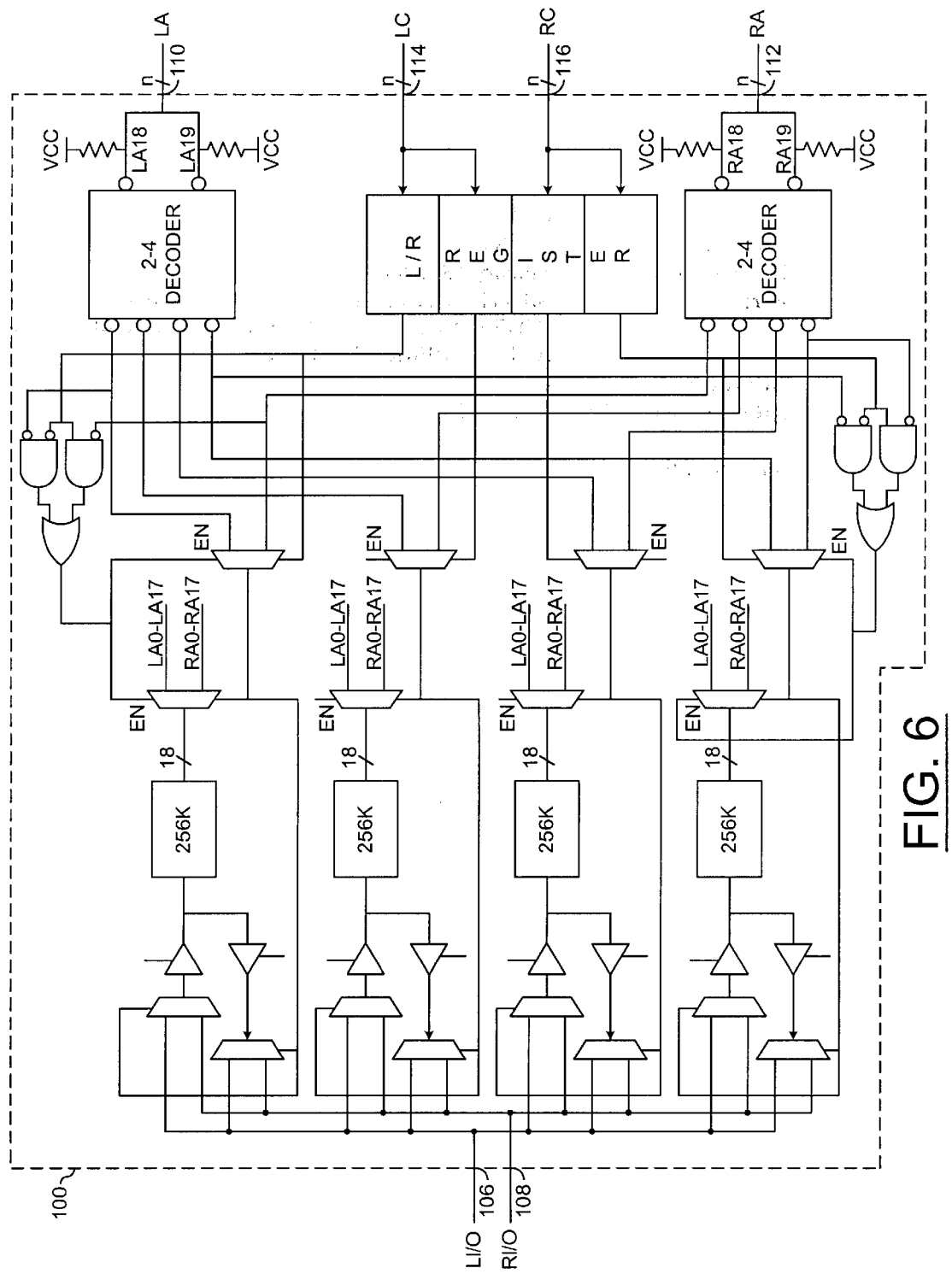
FIG. 6 is a detailed circuit overview of an implementation of a two port SRAM.

Referring to FIG. 6 a circuit overview of the circuit 100 is shown. The circuit 100 is shown implemented on a single die. Furthermore, the circuit 100 may allow for one or more independently configurable SRAM block sizes.

The various signals are generally "on" (e.g., a digital HIGH, or 1) or "off" (e.g., a digital LOW, or 0). However, the particular polarities of the on (e.g., asserted) and off (e.g., deasserted) states of the signals may be adjusted (e.g., reversed) accordingly to meet the design criteria of a particular implementation.

Referring to FIG. 7 a plot of the comparison of logic complexity against the block size granularity is shown. In the example illustrated, the total SRAM size is a 1M word of 16 bits and the SRAM block sizes vary from 16K to 256K bits in a x16 configuration.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
   a memory comprising (i) a first section configured to (a) read and write data and (b) have a first configurable size and (ii) a second section configured to (a) read and write data independently of said first section and (b) have a second configurable size; and
   a logic circuit configured to control the first configurable size and the second configurable size.

2. The circuit according to claim 1, further comprising a register configured to control said logic circuit.

3. The circuit according to claim 2, wherein said register is configured to control said logic circuit in response to one or more first control signals and one or more second control signals.

4. The circuit according to claim 3, wherein said logic circuit is further responsive to one or more first address signals and one or more second address signals.

5. The circuit according to claim 4, wherein (i) each of said one or more first control signals comprise a left port control signal, (ii) each of said one or more first address signals comprise a left port address signal, (iii) each of said one or more second control signals comprise a right port control signal and (iv) each of said one or more second address signals comprise a right port address signal.

6. The circuit according to claim 1, wherein said memory comprises a dual port memory.

7. The circuit according to claim 1, wherein said first section comprises a left port of a dual port memory and said second section comprises a right port of a dual port memory.

8. The circuit according to claim 1, wherein said first and second section s each comprise one or more blocks.

9. The circuit according to claim 8, wherein each of said one or more blocks comprise SRAM blocks.

10. The circuit according to claim 8, wherein said logic circuit is configured to control a number of said one or more blocks in each of said first and second sections.

11. The circuit according to claim 10, wherein one or more control signals are latched during power up to control the number of said one or more blocks that allocated to either of said first and second sections.

12. A circuit comprising:

means for reading and writing data to a first section of a memory having a first configurable size and independently reading and writing data to a second section of said memory having a second configurable size; and means for controlling the first configurable size and the second configurable size.

13. A method for a reading and writing to a memory comprising the steps of:

(A) receiving one or more first configuration bits and one or more second configuration bits indicating a size of a first section and a size of a second section of the memory;

(B) reading and writing data to and/or from said first section of the memory ; and (C) reading and writing data to and/or from said second section of the memory independently of reading and writing data to and/or from said first section.

14. The method according to claim 13, further comprising the step of:

controlling the size of each of said first and second sections in response to said one or more first configuration bits and said one or more second configuration bits.

15. The method according to claim 14, further comprising the step of:

controlling reading and writing to said first and second sections according to one or more first address signals and one or more second address signals.

16. The method according to claim 15, wherein (i) each of said one or more first configuration bits comprises a left port control signal, (ii) each of said one or more first address signals comprises a left port address signal, (iii) each of said one or more second configuration bits comprises a right port control signal and (iv) each of said one or more second address signals comprise a right port address signal.

17. The method according to claim 16, wherein said first section comprises a left port and said second section comprises a right port.

18. The method according to claim 16, wherein said first and second sections each comprise one or more blocks.

19. The method according to claim 16, further comprising the step of:

controlling each size of said one or more blocks of said first and second sections.

* * * * *